United States Patent
Nagai et al.

(10) Patent No.: US 10,030,304 B2
(45) Date of Patent: Jul. 24, 2018

(54) ION IMPLANTATION APPARATUS AND METHOD OF CLEANING ION IMPLANTATION APPARATUS

(71) Applicant: Sumitomo Heavy Industries Ion Technology Co., Ltd., Tokyo (JP)

(72) Inventors: Takayuki Nagai, Ehime (JP); Masateru Sato, Ehime (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 765 days.

(21) Appl. No.: 14/219,682

(22) Filed: Mar. 19, 2014

(65) Prior Publication Data

US 2014/0283745 A1  Sep. 25, 2014

(30) Foreign Application Priority Data

Mar. 19, 2013 (JP) ................. 2013-056306

(51) Int. Cl.
*H01J 37/02* (2006.01)
*C23C 14/56* (2006.01)
(Continued)

(52) U.S. Cl.
CPC ........... *C23C 14/564* (2013.01); *H01J 37/08* (2013.01); *H01J 37/3171* (2013.01); *B08B 7/00* (2013.01);
(Continued)

(58) Field of Classification Search
CPC .... B08B 7/00; C23C 14/564; H01J 2237/006; H01J 2237/022; H01J 2237/182; H01J 37/08; H01J 37/3171
See application file for complete search history.

(56) References Cited

U.S. PATENT DOCUMENTS 5,539,211 A * 7/1996 Ohtoshi ............... B08B 7/0035
134/1.1
5,679,215 A * 10/1997 Barnes ............... C23C 16/4405
134/1.1
(Continued)

FOREIGN PATENT DOCUMENTS

JP  2000-077337 A  3/2000
JP  2001-167728 A  6/2001
(Continued)

*Primary Examiner* — Wyatt Stoffa
(74) *Attorney, Agent, or Firm* — Michael Best & Friedrich LLP

(57) ABSTRACT

An ion implantation apparatus in which a fluorine compound gas is used as a source gas of an ion source, includes a vacuum chamber into which the source gas is introduced; an introduction passage connected to the vacuum chamber and configured to introduce into the vacuum chamber a cleaning gas containing a component that reacts with the fluorine compound deposited inside the vacuum chamber so as to generate a reactant gas; a delivery device configured to forcibly introduce the cleaning gas into the introduction passage; a first adjustment device configured to adjust an amount of gas flow in the introduction passage; an exhausting passage connected to the vacuum chamber and configured to forcibly exhaust the reactant gas along with the cleaning gas; and a second adjustment device configured to adjust an amount of gas flow in the exhausting passage.

18 Claims, 5 Drawing Sheets

(51) Int. Cl.
*H01J 37/08* (2006.01)
*H01J 37/317* (2006.01)
*B08B 7/00* (2006.01)

(52) U.S. Cl.
CPC ... *H01J 2237/006* (2013.01); *H01J 2237/022* (2013.01); *H01J 2237/182* (2013.01)

(56) References Cited

U.S. PATENT DOCUMENTS

| | | | | |
|---|---|---|---|---|
| 5,785,796 A | * | 7/1998 | Lee | B08B 7/00 |
| | | | | 118/715 |
| 7,201,807 B2 | * | 4/2007 | Yim | B08B 7/00 |
| | | | | 134/30 |
| 7,763,311 B2 | * | 7/2010 | Suzuki | B08B 7/00 |
| | | | | 118/715 |
| 8,292,698 B1 | * | 10/2012 | Shih | B24C 1/003 |
| | | | | 451/37 |
| 2005/0252529 A1 | * | 11/2005 | Ridgeway | B08B 7/00 |
| | | | | 134/22.1 |
| 2005/0279382 A1 | * | 12/2005 | Hockele | B08B 7/00 |
| | | | | 134/2 |
| 2007/0169890 A1 | * | 7/2007 | Shishido | C23C 14/564 |
| | | | | 156/345.29 |
| 2007/0190785 A1 | * | 8/2007 | Dando | H01L 21/30604 |
| | | | | 438/689 |
| 2008/0241357 A1 | * | 10/2008 | Suzuki | B08B 7/00 |
| | | | | 427/96.8 |
| 2009/0095713 A1 | * | 4/2009 | Dimeo, Jr. | C23C 14/564 |
| | | | | 216/58 |
| 2010/0154835 A1 | * | 6/2010 | Dimeo | C23C 14/564 |
| | | | | 134/31 |

FOREIGN PATENT DOCUMENTS

| | | |
|---|---|---|
| JP | 2011-226513 A | 11/2010 |
| JP | 2011-053010 A | 3/2011 |
| JP | 2011-238747 A | 11/2011 |
| JP | 2012-517684 A | 8/2012 |

* cited by examiner (a)

(b)

(a)

(b)

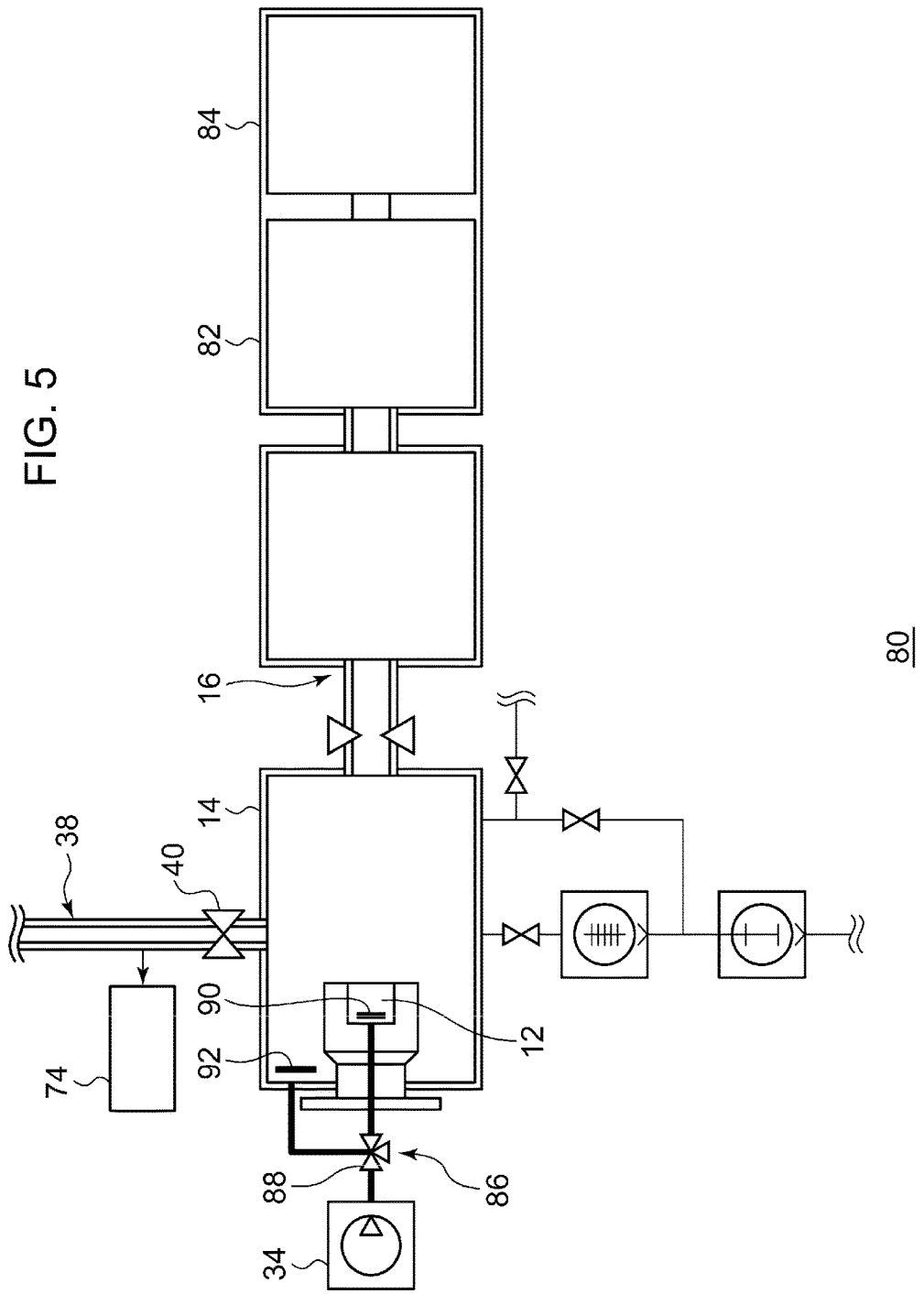

ION IMPLANTATION APPARATUS AND METHOD OF CLEANING ION IMPLANTATION APPARATUS

BACKGROUND OF THE INVENTION

1. Field of the Invention

The present invention relates to an ion implantation apparatus and a method of cleaning an ion implantation apparatus.

2. Description of the Related Art

One of the standard practices in semiconductor manufacturing is to implant ions into a semiconductor wafer for the purpose of modifying conductivity or modifying the crystal structure of the semiconductor wafer. An apparatus used in this step is generally called an ion implantation apparatus.

For example, a fluorine compound gas is used as a gas provided to an ion source in these ion implantation apparatuses. By inducing plasma discharge in the source gas or irradiating the gas with an electron beam, atoms included in the source gas are ionized. Ionized atoms are used for ion implantation. Some of the atoms are deposited inside the apparatus as a fluorine compound.

An ion implantation apparatus needs to be maintained periodically to exchange components or clean the apparatus. If the apparatus is opened to atmosphere while the fluorine compound remains deposited inside a vacuum chamber containing an ion source in the apparatus, the moisture in the incoming atmosphere and the fluorine compound react with each other. The reaction produces a corrosive hydrogen fluoride gas, which makes the maintenance work difficult.

For safety reason, therefore, it is preferable to reduce the amount of deposited fluorine compound to a certain degree before opening the apparatus to atmosphere. More specifically, a method is devised to introduce atmosphere containing moisture into the vacuum chamber of the apparatus, cause the deposited fluorine compound to react with the moisture, and evacuate the chamber via an abatement system until the concentration of hydrogen fluoride (HF) produced drops to a permitted exposure limit or below.

However, the related-art method introduces atmosphere into the apparatus by taking advantage of a pressure difference between the atmospheric pressure and the pressure inside the apparatus so that the atmosphere entering the chamber is decreased in association with a decrease in the pressure difference. As a result, the generation speed of hydrogen fluoride is decreased gradually so that it takes time to decompose and remove the deposited fluorine compound. Since the amount of atmosphere that can be introduced at a time is limited, it is necessary to open and close a valve repeatedly so as to introduce atmosphere into the apparatus and evacuate the apparatus alternately. For this reason, it takes a long time to remove the deposited fluorine compound, and so there is room for further improvement in respect of reduction of maintenance time.

SUMMARY OF THE INVENTION

In this background, an embodiment of the present invention addresses a need to provide a technology capable of reducing the time required for maintenance of an ion implantation apparatus.

The ion implantation apparatus that addresses this need is configured such that a fluorine compound gas is used as a source gas of an ion source. The apparatus includes a vacuum chamber into which the source gas is introduced; an introduction passage connected to the vacuum chamber and configured to introduce into the vacuum chamber a cleaning gas containing a component that reacts with a fluorine compound deposited inside the vacuum chamber so as to generate a reactant gas; a delivery device connected to the introduction passage and configured to forcibly introduce the cleaning gas into the introduction passage; a first adjustment device inserted into the introduction passage and configured to adjust an amount of gas flow in the introduction passage; an exhausting passage connected to the vacuum chamber and configured to forcibly exhaust the reactant product gas from the vacuum chamber along with the cleaning gas; a second adjustment device inserted into the exhausting passage and configured to adjust an amount of gas flow in the exhausting passage; and a controller configured to control the amount of gas flow by the first and second adjustment devices and to control a pressure in the vacuum chamber, in accordance with an operation of the delivery device.

Another embodiment of the present invention relates to a method of cleaning an ion implantation apparatus. The method uses a fluorine compound gas as a source gas and includes forcibly introducing a cleaning gas into a vacuum chamber and concurrently exhausting a reactant gas along with the cleaning gas, the cleaning gas containing a component that reacts with a fluorine compound deposited in a vacuum chamber and generates the reactant gas.

Optional combinations of the aforementioned constituting elements, and implementations of the invention in the form of methods, apparatuses, and systems may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 5 schematically shows the structure of the main part of the ion implantation apparatus according to a variation of the embodiment.

DETAILED DESCRIPTION OF THE INVENTION

The invention will now be described by reference to the preferred embodiments. This does not intend to limit the scope of the present invention, but to exemplify the invention.

A description will first be given of a source gas of an ion source for ion implantation. Generally, when a fluorine compound gas including atoms such as Si, As, P, B, Ge, etc. is used to generate plasma for ion implantation, a fluorine compound is deposited on an area extending from the arc chamber (an ion source head) and the source housing to the beam guide portion. If atmospheric vent is performed for maintenance of an ion implantation apparatus, the moisture in the incoming atmosphere reacts with the fluorine compound. The reaction produces a corrosive hydrogen fluoride (HF) gas, which makes the maintenance work difficult when the apparatus is opened to atmosphere.

For example, when an Ge$^+$ ion beam is generated by using GeF4 as a source gas, a fluorine compound is primarily deposited in an area extending from the arc chamber and the source housing to the beam guide portion. If the apparatus is opened to atmosphere for maintenance in this state, the moisture in the incoming atmosphere and the fluorine compound ($WF_x$, $MoF_x$, $GeF_x$, . . . ) react with each other. The reaction produces a corrosive HF gas, which makes the maintenance work difficult when the apparatus is opened to atmosphere.

To minimize generation of HF gas when the apparatus is maintained, it is necessary to reduce the absolute amount of fluorine compound originating the HF gas in advance. For this purpose, a system (HF gas exhaust system) is used capable of removing the deposited fluorine compound by introducing atmosphere containing atmospheric moisture into the apparatus and by causing the fluorine compound to react with the moisture. The system ensures that the source housing etc. can be maintained safely as the HF gas concentration drops to a permitted exposure limit or below.

Due to the requirement in recent years for high productivity in addition to safety of the apparatus, however, reduction in maintenance time has also become an important concern. The time required to remove the fluorine compound is no exception and so should be reduced. In order to reduce the time required to remove the fluorine compound, an important factor is the efficiency of supplying a cleaning gas (e.g., atmosphere containing vapor) capable of reacting with and removing the fluorine compound to a part where the fluorine compound is deposited.

A detailed description will be given of an embodiment of the present invention with reference to the drawings. Like numerals represent like elements and a description will not be repeated as appropriate. The features described below are by way of example only and do not restrict the scope of the present invention.

Figure 1:
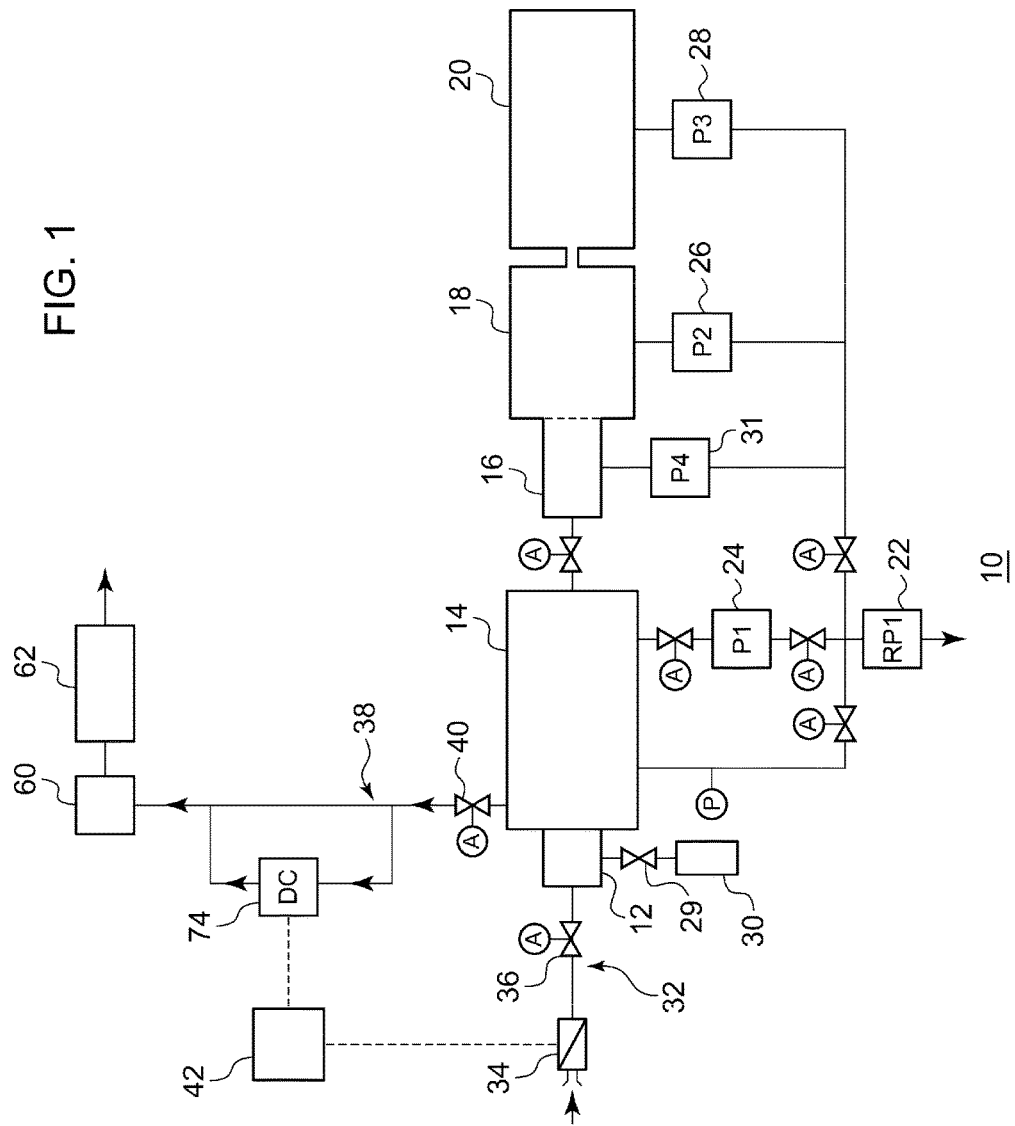
FIG. 1 schematically shows the structure of the main part of the ion implantation apparatus according to the embodiment.

FIG. 1 schematically shows the schematic structure of the ion implantation apparatus according to the embodiment. The ion implantation apparatus 10 shown in FIG. 1 is provided with an arc chamber 12 (ion source head), a source housing 14, a beam guide 16, a resolving housing 18, and a scan housing 20. The arc chamber 12, the source housing 14, the beam guide 16, the resolving housing 18, and the scan housing 20 are roughly evacuated by a roughing pump 22 to a certain vacuum degree and then evacuated by high-evacuation pumps 24, 26, 28, and 31 to reach high vacuum.

In this embodiment, the units from the source housing 14 to the scan housing 20 constitute at least a part of an ion beamline. Once the source housing 14, the beam guide 16, and the resolving housing 18, etc. reach high vacuum, a valve 29 is opened so as to supply a source gas from a source gas chamber 30 to the source housing 14 via the arc chamber 12. The source gas according to the embodiment is exemplified by a fluorine (halogen) compound gas. The fluorine compound gas is exemplified by $SiF_4$, $AsF_3$, $PF_3$, $BF_3$, $GeF_4$, etc.

Ions are generated in the source housing 14, into which the source gas is introduced, by using plasma exhaust, etc. The ions extracted from the source housing 14 are turned into an ion beam and reach a substrate mounted in the scan housing 20 for ion implantation. Details of ion implantation in the ion implantation apparatus 10 are publicly known so that the description is omitted.

As described above, as ions are repeatedly implanted, a compound (fluorine compound) resulting from reaction between fluorine and the metal constituting the inner wall of the arc chamber 12, the source housing 14, etc. is generated and deposited on the inner wall. To address this, the ion implantation apparatus 10 according to the embodiment is provided with: an introduction passage 32 connected to the arc chamber 12, which is a part of the vacuum chamber, and configured to introduce into the arc chamber 12 a cleaning gas containing a component that reacts with the fluorine compound deposited inside the vacuum chamber and generates a reactant gas; a delivery device 34 connected to the introduction passage 32 and configured to forcibly deliver the cleaning gas into the introduction passage 32; a valve 36 inserted into the introduction passage 32 and configured as the first adjustment device for adjusting the amount of gas flow in the introduction passage 32; an exhausting passage 38 connected to the source housing 14, which is a part of the vacuum chamber, and configured to exhaust the reactant gas from the source housing 14 along with the cleaning gas; a valve 40 inserted into the exhausting passage 38 and configured as the second adjustment device for adjusting the amount of gas flow in the exhausting passage 38; and a controller 42 configured to control the amount of gas flow by the valves 36 and 40 and control the pressure in the arc chamber 12 and the source housing 14, in accordance with the operation of the delivery device 34.

The delivery device may include at least one of a positive pressure pump, a fan, and a pressurizing gas bottle. These devices are capable of pressurizing (compressing) the cleaning gas to the atmospheric pressure or higher and delivering the compressed gas to the introduction passage 32. The introduction passage 32 may be connected between the source gas chamber 30 and the arc chamber 12 via a three-way valve, etc.

The cleaning gas is exemplified by atmosphere containing moisture and hydrogen, a gas containing hydrogen, a gas containing hydrogen atoms (a gas containing a hydrogen compound), etc. A gas containing hydrogen atoms is exemplified by $AsH_3$, $PH_3$, etc. By causing hydrogen contained in the cleaning gas to react with the deposited fluorine compound, the reactant HF gas is generated.

In the ion implantation apparatus 10 configured as described above, the delivery device 34 forcibly introduces the cleaning gas into the arc chamber 12, the source housing 14, etc. via the introduction passage 32. As a result, the arc chamber 12, the source housing 14, etc. can be filled with the cleaning gas efficiently. Since the reactant gas is exhausted while the cleaning gas is being introduced, it is possible to introduce the cleaning gas continuously into the arc chamber 12, the source housing 14, etc. As a result, the deposited fluorine compound is reduced in a short period of time, and the time elapsed before the apparatus is opened to atmosphere is reduced accordingly so that the time required to maintain the apparatus is reduced.

Figure 2A:
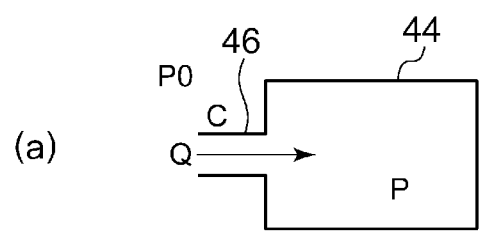
FIG. 2A is a schematic view showing how a cleaning gas is introduced into a vacuum chamber according to a comparative example.

A description will now be given of the mechanism with reference to a comparative example. FIG. 2A is a schematic view showing how a cleaning gas is introduced into a vacuum chamber according to a comparative example; and FIG. 2B shows variation in pressure in the vacuum chamber according to the comparative example.

In the comparative example, the amount of clean gas introduced is changed according to the pressure difference between the pressure outside a vacuum chamber 44 and the pressure inside the vacuum chamber 44 as shown in FIG. 2A. Denoting the amount of clean gas introduced by Q, the conductance of an introduction passage 46 for the gas by C, the pressure outside the vacuum chamber by P0, and the pressure inside the vacuum chamber by P (P0>P), the amount of cleaning gas Q introduced per unit time is given by:

$$Q=C(P0-P) \qquad (1)$$

Figure 2B:
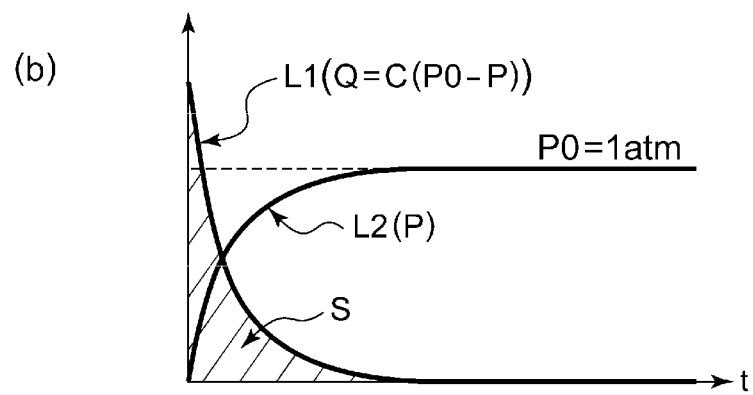
FIG. 2B shows variation in pressure in the vacuum chamber according to the comparative example.

The pressure P inside the vacuum chamber 44 shown in FIG. 2A approaches the pressure P0 (assumed to be equal to the atmospheric pressure 1 atm) outside the vacuum chamber as indicated by line L2 shown in FIG. 2B because the total amount of gas introduced is increased with the elapse of time t. Therefore, the amount of gas introduced Q gradually drops as indicated by line L1. As a result, the amount of cleaning gas that can be introduced into the vacuum chamber 44 at a time will be equal to an area S of FIG. 2B. Therefore, the total amount of gas introduced saturates at a value (S) with the elapse of time. Especially, the amount introduced is hardly increased toward the end of the period.

Figure 3A:
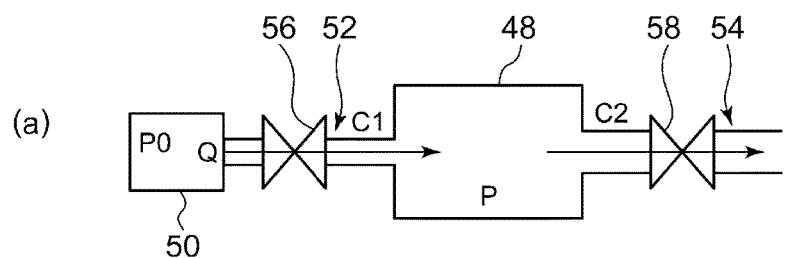
FIG. 3A is a schematic view showing how a cleaning gas is introduced into a vacuum chamber according to the embodiment.
Figure 3B:
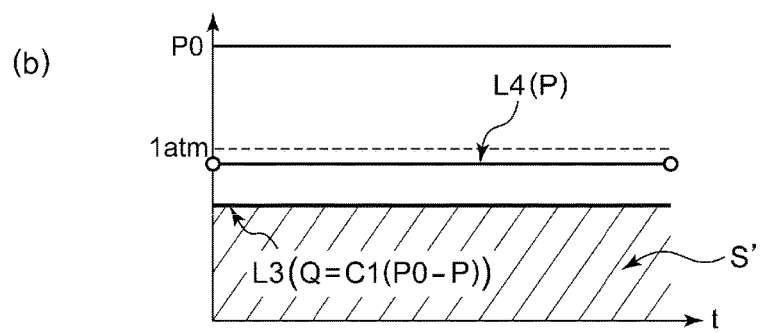
FIG. 3B shows variation in pressure in the vacuum chamber according to the embodiment.

A description will be given of a case of the ion implantation apparatus according to the embodiment. FIG. 3A is a schematic view showing how a cleaning gas is introduced into a vacuum chamber according to the embodiment; and FIG. 3B shows variation of pressure in the vacuum chamber according to the embodiment.

According to the embodiment, a delivery device 50 capable of delivering gas forcibly is used to introduce a cleaning gas instead of the pressure difference between the air pressure outside the vacuum chamber 48 and the air pressure inside the vacuum chamber 48. The vacuum chamber 48 is provided with an exhausting passage 54 as well as an introduction passage 52 for introducing a cleaning gas delivered from the delivery device 50. The introduction passage 52 is provided with a valve 56 for adjusting the amount of flow of the cleaning gas introduced. The exhausting passage 54 is provided with a valve 58 for adjusting the amount of flow of the cleaning gas and the reactant gas exhausted.

Denoting the amount of clean gas introduced by Q, the conductance of the introduction passage 52 for the gas by C1, the conductance of the exhausting passage 54 for the gas by C2 (C1<C2), the pressure generated with the delivery device 50 by P0, and the pressure inside the vacuum chamber by P (P0>P), the amount of cleaning gas Q introduced per unit time is given by:

$$Q=C1(P0-P) \qquad (2)$$

By ensuring that the conductance C2 of the exhausting passage 54 is larger than the conductance C1 of the introduction passage 52, exhaust of the cleaning gas and the reactant gas from the vacuum chamber 48 is facilitated. In order to ensure that the conductance levels meet C1<C2, the apparatus may be configured to meet S1<S2, where S1 denotes a cross sectional area of the introduction passage 52 and S2 denotes a cross sectional area of the exhausting passage 54.

The pressure P inside the vacuum chamber 48 shown in FIG. 3A remains constant (see line L4) with the passage of time t, by properly controlling the delivery device 50 and the valves 56 and 58. By ensuring that the pressure P0 (e.g., 1 atm or higher) of the cleaning gas delivered from the delivery device 50 is constant, the amount introduced Q also remains constant (see line L3). As a result, the amount of cleaning gas that can be introduced into the vacuum chamber 48 is not limited. The total amount of cleaning gas introduced will be equal to an area S' of FIG. 3B. For this reason, the total amount of introduced gas does not saturate at a certain value (S in FIG. 2B) with the elapse of time. The cleaning gas can be supplied continuously into the vacuum chamber 48 in a constant amount.

Thus, the cleaning method according to the embodiment can be applied to ion implantation apparatuses in which a fluorine compound gas is used as a source gas. The cleaning method forcibly introduces into the vacuum chamber a cleaning gas containing a component that reacts with the fluorine compound deposited inside the vacuum chamber and generates a reactant gas, and concurrently exhausts the reactant gas along with the cleaning gas.

According to the method, the cleaning gas is forcibly introduced into the vacuum chamber via the introduction passage. Therefore, the vacuum chamber is filled with the cleaning gas efficiently. Since the reactant gas is exhausted while the cleaning gas is being introduced, a larger amount of cleaning gas can be continuously introduced into the vacuum chamber than the related art. As a result, the deposited fluorine compound can be reduced in a short period of time, and the time elapsed before the apparatus is opened to atmosphere can be reduced so that the time required to maintain the apparatus can be reduced.

The controller 42 of the ion implantation apparatus 10 shown in FIG. 1 is configured to control the valve 36 while the delivery device 34 is in operation so as to introduce the cleaning gas into the arc chamber 12 and the source housing 14, and also to control the valve 40 to exhaust the reactant gas and the cleaning gas from the source housing 14.

The controller 42 may control at least one of the valves 36 and 40 so that the pressure P inside the vacuum chamber remains in a range 0.1 atm$\leq$P$\leq$1.0 atm or a range 0.1 atm$\leq$P$\leq$1.5 atm while the delivery device 34 is in operation. This can clean (remove) the fluorine compound deposited inside the vacuum chamber efficiently. The term "control at least one of the valves 36 and 40" encompasses maintaining the valve(s) undriven and in a constant state as well as driving the valve(s).

In the ion implantation apparatus 10 according to the embodiment, a pump 60 as an exhausting device for continuously and forcibly exhausting the cleaning gas and the reactant gas is provided in the exhausting passage 38 shown in FIG. 1. In this way, the reactant gas and the cleaning gas are exhausted efficiently. Preferably, the pump 60 is a dry pump highly resistant to corrosion. This makes it possible to maintain desired exhausting performance for a prolonged period of time even if the reactant gas is a highly corrosive gas such as HF gas. The cleaning gas and the reactant gas exhausted by the pump 60 is properly rendered harmless by an abatement system 62 before being released outside.

According to the embodiment, for example, the delivery device 34 is implemented by a positive pressure pump capable of introducing a cleaning gas at 2-3 atm in an amount of 45 l/min. For example, a pump capable of exhausting 1000 l/min is used as the pump 60 in the exhausting passage 38. In this case, the pressure difference can be controlled by adjusting the amount of flow in the introduction passage 32 and the exhausting passage 38 so that the pressure inside the source housing 14 approximates the atmospheric pressure (e.g., 0.1 atm$\leq$P<1.0 atm) and the amount of cleaning gas introduced can be increased. Pressure sensors for directly or indirectly detecting the pressure are provided in respective units in the ion implantation apparatus 10 including the introduction passage 32, the exhausting passage 38, the source housing 14, etc.

The atmosphere may be guided through water in the introduction passage 32 so as to increase the content of moisture (water vapor) before being introduced into the vacuum chamber such as the arc chamber 12 and the source housing 14. Alternatively, the atmosphere may be mixed with a gas containing moisture or with water vapor so as to increase the content of moisture before being introduced into the vacuum chamber such as the arc chamber 12 and the source housing 14. This can increase the moisture concentration in the cleaning gas and improve the efficiency of cleaning the fluorine compound deposited. Still alternatively, an inert gas may be introduced concurrently with the introduction of a cleaning gas so as to purge the interior of the vacuum chamber. This makes the apparatus ready for operation immediately after the interior of the vacuum chamber is cleaned.

Figure 4A:
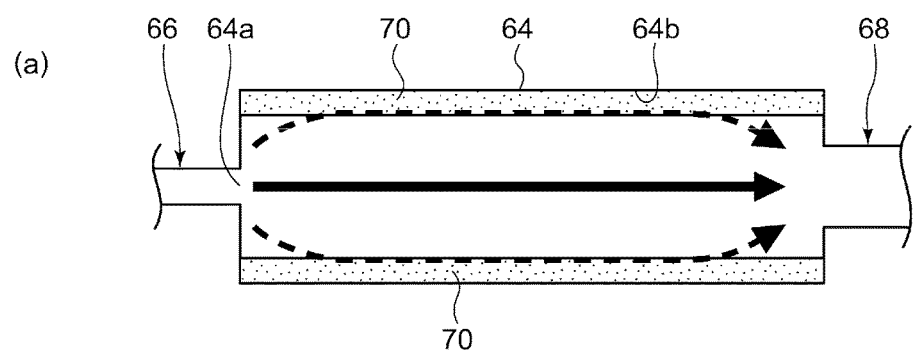
FIG. 4A schematically shows the flow of a cleaning gas occurring when the vacuum chamber is not provided with a diffusing member.

A description will be given of a diffusing member provided in the vacuum chamber. FIG. 4A schematically shows the flow of a cleaning gas occurring when the vacuum chamber is not provided with a diffusing member; and FIG. 4B schematically shows the flow of a cleaning gas occurring when the vacuum chamber is provided with a diffusing member.

In the case of a vacuum chamber 64 shown in FIG. 4A, an opening 64a is provided at the connection to an introduction passage 66. Only a small amount of the cleaning gas introduced via the opening 64a is guided toward an inner wall 64b, a majority of the cleaning gas is guided straight toward an exhausting passage 68. For this reason, the chance of the cleaning gas being in contact with a fluorine compound 70 deposited on the inner wall 64b is small. It cannot therefore be hoped that the cleaning efficiency is improved.

Figure 4B:
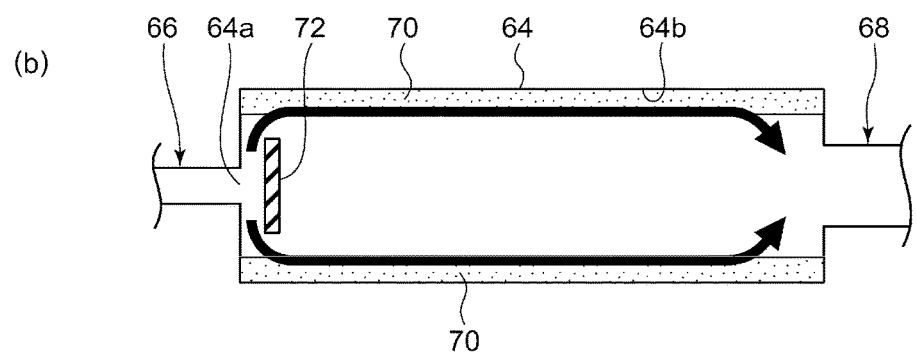
FIG. 4B schematically shows the flow of a cleaning gas occurring when the vacuum chamber is provided with a diffusing member.

Meanwhile, the vacuum chamber 64 shown in FIG. 4B is provided with a diffusing member 72 for diffusing the cleaning gas introduced via the opening 64a toward the wall surface of the vacuum chamber 64. The diffusing member 72 is provided to shield the opening 64a at a position slightly removed from the opening 64a. This prevents the cleaning gas introduced via the introduction passage 66 from being guided straight toward the exhausting passage 68. This increases the chance of contact of the cleaning gas with the fluorine compound 70 deposited on the inner wall 64b. Reaction between the fluorine compound 70 and the cleaning gas is promoted so that the cleaning efficiency is improved and the deposited fluorine compound is reduced more efficiently.

The diffusing member 72 may also function as a liner. This can reduce the number of components. The opening 64a may be provided with a nozzle to blow the cleaning gas toward a desired area.

A description will be given of detection of the concentration of the reactant gas exhausted, and, more specifically, the HF gas. According to the related art, measurement of the concentration of the HF gas generated is done by sampling the gas from the sealed vacuum chamber. The HF gas continues to be produced by the cleaning gas even while the measurement is being done so that measurement value tends to remain at a high level. This has resulted in a difference between the actual measurement of concentration inside the vacuum chamber exposed to the atmosphere and the measurement by the HF gas detector provided in the apparatus. In other words, the measurement by the HF gas detector may be higher than the actual HF gas concentration so that cleaning may be continued despite the fact that the interior of the vacuum chamber has already been cleaned to a safe level. This could wastefully prolong the time of maintenance.

According to the embodiment, this is addressed by providing the exhausting passage 38 of the ion implantation apparatus 10 with a detector 74 for detecting the concentration of the exhausted reactant gas, as shown in FIG. 1. For example, introduction of atmosphere is continued until the detected HF gas concentration drops below a permitted exposure limit of 3 ppm. Since it is accurately known whether the vacuum chamber is cleaned sufficiently, the timing of opening the interior of the vacuum chamber to atmosphere can be known accurately. In other words, it does not take more than necessary time for cleaning so that the maintenance time is reduced.

FIG. 5 schematically shows the structure of the main part of the ion implantation apparatus according to a variation of the embodiment. Those components which are similar to the components of the ion implantation apparatus 10 shown in FIG. 1 are denoted by the same reference numerals so that a description thereof is omitted.

In an ion implantation apparatus 80 shown in FIG. 5, a beamline housing 82 and an implantation process housing 84 are provided downstream of the beam guide 16. The arc chamber 12, the source housing 14, and the delivery device 34 are connected via an introduction passage 86. The introduction passage 86 is provided with a three-way valve 88 for switching the passage so that the cleaning gas delivered from the delivery device 34 can be introduced into at least one of the arc chamber 12 and the source housing 14. By switching the three-way valve 88, the cleaning gas can be introduced into the arc chamber 12 and the source housing 14 properly.

The arc chamber 12 shown in FIG. 5 is provided with a diffusing member 90 for diffusing the cleaning gas, which is introduced via an opening (see the opening 64a shown in FIG. 4B) connected to the introduction passage 86, toward the wall surface of the arc chamber 12. Similarly, the source housing 14 shown in FIG. 5 is provided with a diffusing member 92 for diffusing the cleaning gas, which is introduced via an opening connected to the introduction passage 86, toward the wall surface of the source housing 14.

The diffusing members 90, 92 are provided to shield the openings, respectively, at positions slightly removed from the opening. This prevents the cleaning gas introduced via the introduction passage 86 from being guided straight toward the exhausting passage 38. This increases the chance of contact of the cleaning gas with the fluorine compound deposited on the inner wall of the arc chamber 12 and the source housing 14. Reaction between the fluorine compound and the cleaning gas is promoted so that the cleaning efficiency is improved and the deposited fluorine compound is reduced more efficiently.

As described above, the controller 42 of the ion implantation apparatus 10 and ion implantation apparatus 80 according to the embodiment may be configured to control the pressure in the vacuum chamber by detecting pressure in the vacuum chamber such as the arc chamber 12 and the source housing 14 while the delivery device 34 is in operation.

Alternatively, the pressure in the vacuum chamber may be controlled by detecting the pressure in the vacuum chamber produced by the cleaning gas and the reactant gas generated by the cleaning reaction in the vacuum chamber (arc chamber 12 and the source housing 14), while the amount of flow of the cleaning gas adjusted by the valve 36 (first adjustment device) is being larger than the amount of flow of the exhausted gas adjusted by the valve 40 (second adjustment device). In this case, the pressure in the vacuum chamber may be controlled to be maintained at a constant level. Alternatively, the pressure in the vacuum chamber that should be maintained may be in the range below 1.0 atm.

The delivery device 34 may introduce the cleaning gas at a pressure at least between 1.0 atm and several atm. For example, the cleaning gas may be introduced at a pressure below 10 atm, below 8 atm, or below 5 atm.

Still alternatively, the vacuum chamber may be formed by the arc chamber 12 of the ion source, the source housing 14 accommodating the arc chamber 12, and the ion beamline. The arc chamber 12 may be provided with an introduction passage, and the source housing 14 or the ion beamline may be provided with an exhausting passage. Still alternatively, the ion beamline may be provided with an introduction passage.

The embodiments of the present invention are not limited to those described above and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

Priority is claimed to Japanese Patent Application No. 2013-056306, filed Mar. 19, 2013, the entire content of which is incorporated herein by reference.

What is claimed is:

1. An ion implantation apparatus in which a fluorine compound gas is used as a source gas of an ion source, comprising:
    a vacuum chamber into which the source gas is introduced;
    an introduction passage connected to the vacuum chamber and configured to introduce into the vacuum chamber a cleaning gas containing a component that reacts with a fluorine compound deposited inside the vacuum chamber and generates a reactant gas;
    a delivery device connected to the introduction passage and configured to forcibly introduce the cleaning gas into the introduction passage;
    a first valve inserted into the introduction passage and configured to adjust an amount of gas flow in the introduction passage;
    an exhausting passage connected to the vacuum chamber and configured to forcibly exhaust the reactant gas from the vacuum chamber along with the cleaning gas;
    a second valve inserted into the exhausting passage and configured to adjust an amount of gas flow in the exhausting passage; and
    a controller configured to control the amount of gas flow by the first and second valves and to control a pressure in the vacuum chamber, in accordance with an operation of the delivery device, wherein
    the cleaning gas is an ambient air including moisture, and
    the delivery device includes at least one of a positive pressure pump or a fan configured to pressurize the cleaning gas to an atmospheric pressure or higher and to deliver the compressed cleaning gas to the introduction passage.

2. The ion implantation apparatus according to claim 1, wherein
    the controller controls the first valve while the delivery device is in operation so as to introduce the cleaning gas into the vacuum chamber, and controls the second valve to exhaust the reactant gas and the cleaning gas from the vacuum chamber.

3. The ion implantation apparatus according to claim 2, wherein
    the controller controls the pressure in the vacuum chamber by detecting the pressure in the vacuum chamber while the delivery device is in operation.

4. The ion implantation apparatus according to claim 2, wherein
    the controller controls the pressure in the vacuum chamber by detecting the pressure in the vacuum chamber containing the cleaning gas and reactant gas, while the amount of gas flow in the introduction passage adjusted by the first valve is larger than the amount of gas flow in the exhausting passage adjusted by the second valve.

5. The ion implantation apparatus according to claim 2, wherein
    the controller controls the first valve and the second valve so that the pressure in the vacuum chamber is constant.

6. The ion implantation apparatus according to claim 5, wherein
    the pressure in the vacuum chamber is below 1.0 atm.

7. The ion implantation apparatus according to claim 2, wherein
    the delivery device introduces the cleaning gas at a pressure between 1.0 atm and 5 atm.

8. The ion implantation apparatus according to claim 2, wherein
    the controller controls at least one of the first and second valves so that the pressure (P) in the vacuum chamber remains in a range $0.1 \text{ atm} \leq P < 1.0 \text{ atm}$ while the delivery device is in operation.

9. The ion implantation apparatus according to claim 2, wherein
    the controller controls at least one of the first and second valves so that the pressure (P) in the vacuum chamber remains in a range $0.1 \text{ atm} \leq P < 1.5 \text{ atm}$ while the delivery device is in operation.

10. The ion implantation apparatus according to claim 1, wherein
    the vacuum chamber is provided with an opening at the connection to the introduction passage, and with a diffusing member for diffusing the cleaning gas introduced via the opening toward a wall surface of the vacuum chamber.

11. The ion implantation apparatus according to claim 1, wherein
    the exhausting passage is provided with an exhaust device for forcibly exhausting the reactant gas.

12. The ion implantation apparatus according to claim 11, wherein
    the exhaust device is provided with a dry pump resistant to corrosion.

13. The ion implantation apparatus according to claim 1, wherein
    denoting the conductance of the introduction passage by C1, and the conductance of the exhausting passage by C2, the introduction passage and the exhausting passage are configured such that C1<C2.

14. The ion implantation apparatus according to claim 1, wherein
    the apparatus is configured to meet S1<S2, where S1 denotes a cross sectional area of the introduction passage and S2 denotes a cross sectional area of the exhausting passage.

15. The ion implantation apparatus according to claim 1, wherein
the vacuum chamber comprises the arc chamber that is an ion source head, a source housing accommodating the arc chamber, and an ion beamline, and
the arc chamber is connected with the introduction passage, and the source housing or the ion beamline is connected with the exhausting passage.

16. The ion implantation apparatus according to claim 15, wherein
the introduction passage is provided in the source housing or the ion beamline.

17. The ion implantation apparatus according to claim 15, wherein
the vacuum chamber forms at least a part of the source housing and the ion beamline.

18. The ion implantation apparatus according to claim 1, wherein
the exhausting passage is provided with a detection device configured to detect a concentration of the exhausted reactant gas.

\* \* \* \* \*